(12) United States Patent
Zhang

(10) Patent No.: US 12,096,658 B2
(45) Date of Patent: Sep. 17, 2024

(54) METHOD OF MANUFACTURING DISPLAY PANEL AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Xingyong Zhang, Wuhan (CN)

(73) Assignee: WUHAN CHINA STAR OPTOELECTRONICS SEMICONDUCTOR DISPLAY TECHNOLOGY CO., LTD, Wuhan (CN)

( * ) Notice: Subject to any disclaimer, the term of this patent is extended or adjusted under 35 U.S.C. 154(b) by 787 days.

(21) Appl. No.: 17/264,225

(22) PCT Filed: Jul. 21, 2020

(86) PCT No.: PCT/CN2020/103143
§ 371 (c)(1),
(2) Date: Jan. 28, 2021

(87) PCT Pub. No.: WO2021/258459
PCT Pub. Date: Dec. 30, 2021

(65) Prior Publication Data
US 2022/0190066 A1    Jun. 16, 2022

(30) Foreign Application Priority Data

Jun. 23, 2020  (CN) .......................... 202010577635.3

(51) Int. Cl.
*H10K 59/122*  (2023.01)
*H10K 50/84*  (2023.01)
(Continued)

(52) U.S. Cl.
CPC ........... *H10K 59/122* (2023.02); *H10K 50/84* (2023.02); *H10K 71/00* (2023.02); *H10K 71/135* (2023.02)

(58) Field of Classification Search
CPC ..... H10K 71/00–861; H10K 50/00–88; H10K 59/00–95; H10K 65/00;
(Continued)

(56) References Cited

U.S. PATENT DOCUMENTS

2017/0157949 A1*  6/2017  Madigan ................. B41J 3/407
2018/0208583 A1   7/2018  Kunimoto et al.
(Continued)

FOREIGN PATENT DOCUMENTS

CN    103311449 A  *  9/2013
CN    103928497 A      7/2014
(Continued)

OTHER PUBLICATIONS

Jung, S. (2011). "Fluid characterization and drop impact in inkjet printing for organic semiconductor devices" (Year: 2011).*
(Continued)

*Primary Examiner* — Eric A. Ward
*Assistant Examiner* — Nora Taylor Nix
(74) *Attorney, Agent, or Firm* — PV IP PC; Wei Te Chung

(57) ABSTRACT

Embodiments of the present disclosure provide a method of manufacturing a display panel and the display panel. The method of manufacturing the display panel includes providing an array substrate; forming an anode layer on the array substrate; forming a first pixel defining layer on the array substrate and the anode layer, wherein the first pixel defining layer includes a pixel opening exposing the anode layer; etching the first pixel defining layer to form a second pixel defining layer; forming a light-emitting layer covering the
(Continued)

anode layer in an area of the pixel opening; forming a cathode layer on the light-emitting layer; and forming an encapsulation layer covering the cathode layer, the second pixel defining layer, and the array substrate.

14 Claims, 3 Drawing Sheets

(51) Int. Cl.
*H10K 71/00* (2023.01)
*H10K 71/13* (2023.01)

(58) Field of Classification Search
CPC ...... H10K 2102/00–361; H10K 71/135; B32B 2457/206
See application file for complete search history.

(56) References Cited

U.S. PATENT DOCUMENTS

| | | | | |
|---|---|---|---|---|
| 2018/0225500 A1* | 8/2018 | Han | ................. | G06V 40/1318 |
| 2018/0351126 A1* | 12/2018 | Choi | ................. | G09G 3/3291 |
| 2020/0203469 A1* | 6/2020 | Li | ................. | H10K 59/122 |
| 2020/0343322 A1* | 10/2020 | Jia | ................. | H10K 59/35 |
| 2021/0151521 A1* | 5/2021 | Liu | ................. | H10K 59/131 |
| 2021/0408504 A1* | 12/2021 | Geng | ................. | H10K 71/00 |
| 2022/0052131 A1* | 2/2022 | Li | ................. | H10K 59/173 |

FOREIGN PATENT DOCUMENTS

| | | |
|---|---|---|
| CN | 103996697 A | 8/2014 |
| CN | 105140236 A | 12/2015 |
| CN | 108807496 A | 11/2018 |
| CN | 109256408 A | 1/2019 |
| CN | 109585523 A | 4/2019 |
| CN | 110299388 A | 10/2019 |

OTHER PUBLICATIONS

Jou et al., "Efficient, color-stable fluorescent white organic light-emitting diodes with single emission layer by vapor deposition from solvent premixed deposition source," Appl. Phys. Lett. 88, 193501 (2006) (Year: 2006).*

* cited by examiner

METHOD OF MANUFACTURING DISPLAY PANEL AND DISPLAY PANEL

RELATED APPLICATIONS

This application is a Notional Phase of PCT Patent Application No. PCT/CN2020/103143 having international filing date of Jul. 21, 2020, which claims the benefit of priority of Chinese Patent Application No. 202010577635.3 filed on Jun. 23, 2020. The contents of the above applications are all incorporated by reference as if fully set forth herein in their entirety.

FIELD OF INVENTION

The present disclosure relates to the field of display technology, and more particularly to a manufacturing method of a display panel and the display panel.

BACKGROUND OF INVENTION

Organic lighting emitting diode (OLED) devices have received widespread attention because of their advantages such as self-luminosity, rich colors, fast response times, wide viewing angles, light weight, and ability to be made into flexible displays.

However, in a manufacturing process of OLED devices, some processes are cumbersome and production efficiency of the OLED devices may even affect product quality. Take a pixel definition layer as an example, a traditional pixel definition layer is formed by a single exposure and development technology, which is relatively cumbersome, and an etching process easily damages a surface of an anode layer.

SUMMARY OF INVENTION

The embodiments of the present disclosure provide a manufacturing method of a display panel and a display panel, which can simplify the manufacturing process of the pixel defining layer.

In a first aspect, one embodiment of the present disclosure provides a method of manufacturing a display panel, including:
  providing an array substrate;
  forming an anode layer on the array substrate;
  forming a first pixel defining layer on the array substrate and the anode layer, the first pixel defining layer comprising a pixel opening exposing the anode layer;
  etching the first pixel defining layer to form a second pixel defining layer;
  forming a light-emitting layer covering the anode layer in an area of the pixel opening;
  forming a cathode layer on the light-emitting layer; and
  forming an encapsulation layer covering the cathode layer, the second pixel defining layer, and the array substrate.

In the method of manufacturing the display panel provided by one embodiment of the present disclosure, wherein the step of forming the first pixel defining layer on the array substrate and the anode layer, the first pixel defining layer comprising a pixel opening exposing the anode layer further includes:
  providing an inkjet printer; and
  forming the first pixel defining layer having the pixel opening exposing the anode layer on the array substrate and the anode layer by adjusting a pitch of nozzles of the inkjet printer and a jetting volume of ink.

In the method of manufacturing the display panel provided by one embodiment of the present disclosure, wherein the first pixel defining layer further comprises a first spacer, and the step of etching the first pixel defining layer to form the second pixel defining layer further includes:
  placing a mask on the array substrate on which the first pixel defining layer is formed, wherein the mask is provided with an opening corresponding to the first spacer; and
  etching the first spacer of the first pixel defining layer to form the second pixel defining layer, wherein the second pixel defining layer comprises a second spacer and a pixel opening exposing the anode layer.

In the method of manufacturing the display panel provided by one embodiment of the present disclosure, wherein the first spacer is a hemisphere, and a width of a side of the first spacer away from the array substrate is less than a width of a side of the first spacer close to the array substrate.

In the method of manufacturing the display panel provided by one embodiment of the present disclosure, wherein a shape of the opening is circular, and a width of the opening is same as the width of the side of the first spacer away from the array substrate.

In the method of manufacturing the display panel provided by one embodiment of the present disclosure, wherein an etching amount at a dome position of the first spacer is greater than an etching amount at other positions of the first spacer.

In the method of manufacturing the display panel provided by one embodiment of the present disclosure, wherein the step of etching the first spacer of the first pixel defining layer to form the second pixel defining layer includes:
  forming the second pixel defining layer by adjusting an etching rate and etching period for the first spacer of the first pixel defining layer.

In the method of manufacturing the display panel provided by one embodiment of the present disclosure, wherein the step of forming the light-emitting layer covering the anode layer in the area of the pixel opening further includes:
  providing a vapor deposition machine; and
  forming the light-emitting layer covering the anode layer by vapor deposition in the pixel opening area by the vapor deposition machine.

In the method of manufacturing the display panel provided by one embodiment of the present disclosure, wherein a thickness of the light-emitting layer is less than or equal to a thickness of the second pixel defining layer.

In the method of manufacturing the display panel provided by one embodiment of the present disclosure, wherein the array substrate comprises a substrate, and a buffer layer, an active layer, a first insulating layer, a gate layer, a second insulating layer, a source-drain layer, and a third insulating layer formed on the substrate in order.

In a second aspect, one embodiment of the present disclosure provides a display panel. The display panel including:
  an array substrate;
  an anode layer disposed on the array substrate;
  a second pixel defining layer disposed on the array substrate and the anode layer, the second pixel defining layer comprising a pixel opening exposing the anode layer;
  a light-emitting layer provided in the pixel opening area and covering the anode layer;
  a cathode layer disposed on the light-emitting layer; and
  an encapsulation layer covering the cathode layer, the second pixel defining layer, and the array substrate.

In the display panel provided by one embodiment of the present disclosure, the second pixel defining layer is formed by etching the first pixel defining layer after forming a first pixel defining layer having a pixel opening exposing the anode layer on the array substrate and the anode layer.

In the display panel provided by one embodiment of the present disclosure, wherein forming a first pixel defining layer having a pixel opening exposing the anode layer on the array substrate and the anode layer further includes:

providing an inkjet printer; and forming the first pixel defining layer having the pixel opening exposing the anode layer on the array substrate and the anode layer by adjusting a pitch of nozzles of the inkjet printer and a jetting volume of ink.

In the display panel provided by one embodiment of the present disclosure, the first pixel defining layer further comprises a first spacer, and etching the first pixel defining layer further including:

placing a mask on the array substrate on which the first pixel defining layer is formed, wherein the mask is provided with an opening corresponding to the first spacer; and etching the first spacer of the first pixel defining layer.

In the display panel provided by one embodiment of the present disclosure, the first spacer is a hemisphere, and a width of a side of the first spacer away from the array substrate is less than a width of a side of the first spacer close to the array substrate.

In the display panel provided by one embodiment of the present disclosure, wherein a shape of the opening is circular, and a width of the opening is same as the width of the side of the first spacer away from the array substrate.

In the display panel provided by one embodiment of the present disclosure, wherein an etching amount at a dome position of the first spacer is greater than an etching amount at other positions of the first spacer.

In the display panel provided by one embodiment of the present disclosure, wherein the second pixel defining layer further comprises a second spacer, and a width of a side of the second spacer away from the array substrate is less than a width of a side of the second spacer close to the array substrate.

In the display panel provided by one embodiment of the present disclosure, wherein a thickness of the light-emitting layer is less than or equal to a thickness of the second pixel defining layer.

In the display panel provided by one embodiment of the present disclosure, wherein the array substrate comprises a substrate, and a buffer layer, an active layer, a first insulating layer, a gate layer, a second insulating layer, a source-drain layer, and a third insulating layer formed on the substrate in order.

Embodiments of the present disclosure disclose a method of manufacturing a display panel and the display panel. The method of manufacturing the display panel includes providing an array substrate; forming an anode layer on the array substrate; forming a first pixel defining layer on the array substrate and the anode layer, the first pixel defining layer includes a pixel opening exposing the anode layer; etching the first pixel defining layer to form a second pixel defining layer; forming a light-emitting layer covering the anode layer in an area of the pixel opening; forming a cathode layer on the light-emitting layer; and forming an encapsulation layer covering the cathode layer, the second pixel defining layer, and the array substrate. This solution can simplify the manufacturing process of the pixel defining layer.

DESCRIPTION OF FIGURES

In order to more clearly explain the embodiments or the technical solutions in the prior art, the following will briefly introduce the figures required in the description of the embodiments or the prior art. Obviously, the figures in the following description are only for some embodiments of the present disclosure, those of ordinary skill in the art can obtain other figures based on these figures without any inventive steps.

DETAILED DESCRIPTION OF PREFERRED EMBODIMENTS

The technical solutions in the embodiments of the present disclosure will be described clearly and completely in conjunction with the figures in the embodiments of the present disclosure. Obviously, the described embodiments are only a part of the embodiments of the present disclosure, but not all the embodiments. Based on the embodiments in the present disclosure, all other embodiments obtained by those skilled in the art without inventive steps fall within the protection scope of the present disclosure.

The embodiments of the present disclosure provide a method of manufacturing a display panel and the display panel, which will be described in detail below.

Figure 1:
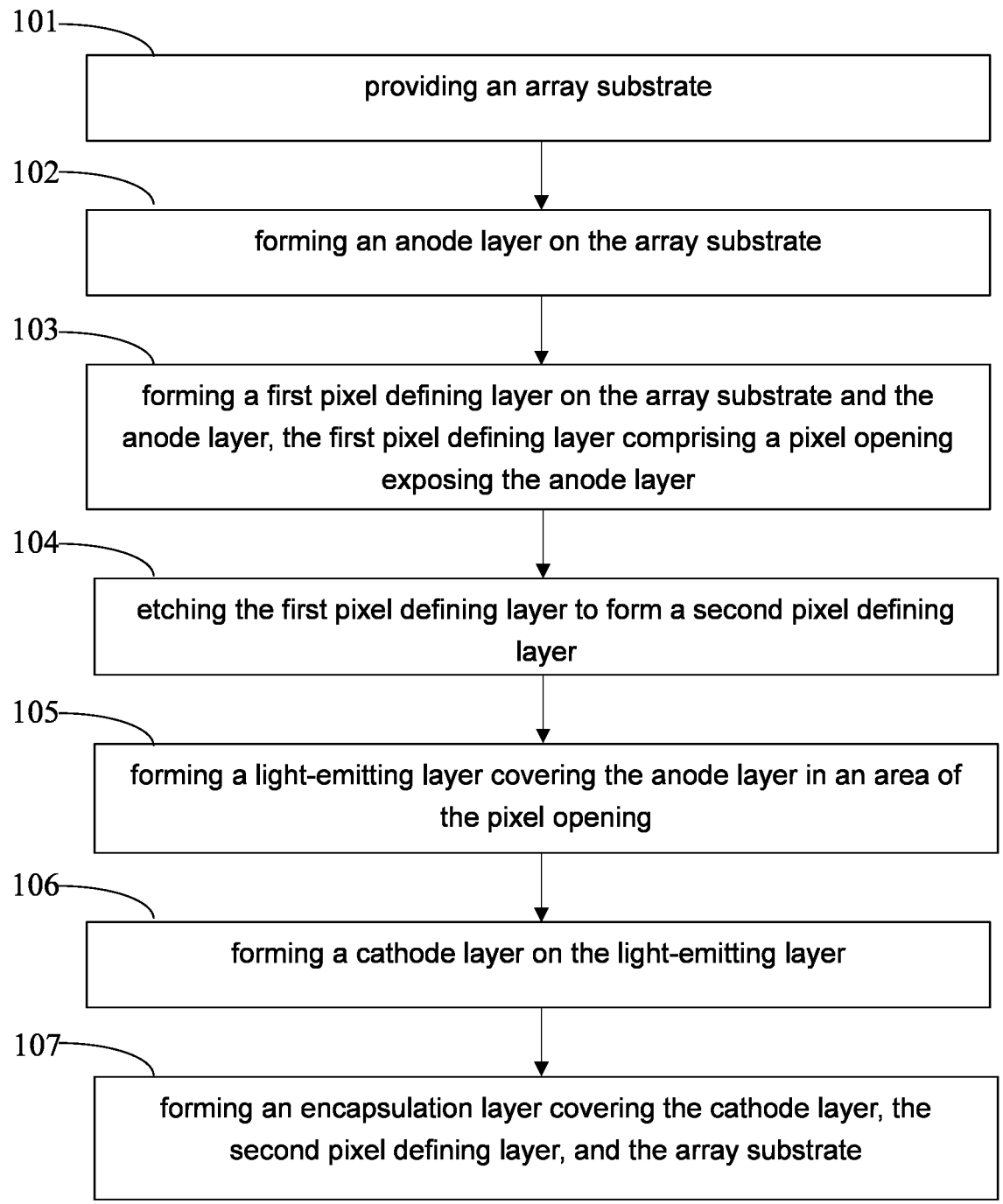
FIG. 1 is a schematic flowchart of a method of manufacturing a display panel provided by one embodiment of the present disclosure.

Please refer to FIG. 1, which is a schematic flowchart of a method of manufacturing a display panel provided by one embodiment of the present disclosure. The display panel 100 shown in FIG. 4 can be formed by the method of manufacturing the display panel. The specific process of the method of manufacturing the display panel may be as follows:

101: Providing an array substrate 10.

Figure 6:
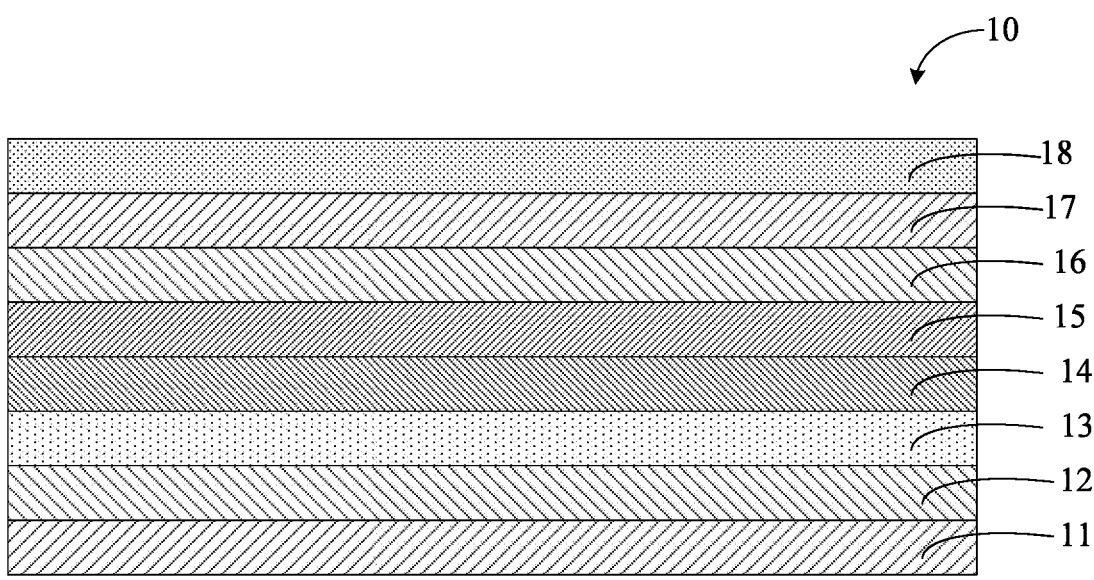
FIG. 6 is a schematic structural diagram of an array substrate provided by one embodiment of the present disclosure.

The array substrate 10 may include a substrate 11 and a buffer layer 12, an active layer 13, a first insulating layer 14, a gate layer 15, a second insulating layer 16, a source-drain layer 17, and a third insulating layer 18 formed on the substrate 11 in this order, as shown in FIG. 6.

The substrate 11 may be a flexible substrate, and the material of the substrate 11 may be polyimide.

It should be noted that in the description of the present disclosure, the terms "first", "second", "third", etc. are used for descriptive purposes only, and cannot be understood as indicating or implying relative importance or implicitly indicating a number of technical features. Thus, features defined as "first", "second", and "third" may explicitly or implicitly include one or more of the features.

102: Forming an anode layer 20 on the array substrate 10.

The anode layer 20 can be electrically connected to the source-drain layer 17 of the array substrate 10.

103: Forming a first pixel defining layer 30 on the array substrate 10 and the anode layer 20, the first pixel defining layer 30 including a pixel opening 33 exposing the anode layer 20.

Figure 2:
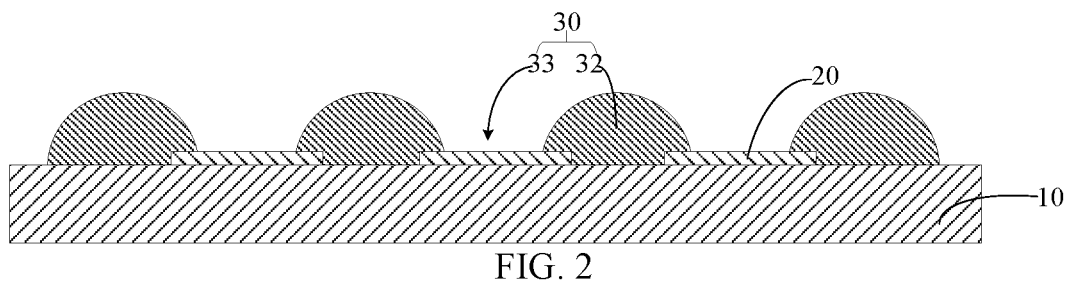
FIG. 2 is a schematic structural diagram of a first intermediate product of the display panel provided by one embodiment of the present disclosure.

Specifically, an inkjet printer can be provided as specifically shown in FIG. 2, forming the first pixel defining layer 30 having the pixel opening 33 exposing the anode layer 20 on the array substrate 10 and the anode layer 20 by adjusting a pitch of nozzles of the inkjet printer and a jetting volume of ink.

It can be understood that the pitch of nozzles of the inkjet printer may determine a size of the pixel opening 33, and an amount of inkjet may determine a height of a first spacer 32 of the first pixel defining layer 30.

It should be noted that the first spacer 32 formed on the array substrate 10 and the anode layer 20 by the inkjet printer is a hemisphere. A width of a side of the first spacer 32 away from the array substrate 10 is less than a width of a side of the first spacer 32 close to the array substrate.

A material of the first spacer 32 may include organic materials such as acrylic, epoxy, or polyimide.

104: Etching the first pixel defining layer 30 to form a second pixel defining layer 31.

Specifically, a mask 70 may be placed on the array substrate 10 on which the first pixel defining layer 30 is formed. Then, etching the first spacer 32 of the first pixel defining layer 30 to form the second pixel defining layer 31. It should be noted that the mask 70 is provided with openings 71 corresponding to the first spacers 32.

In some embodiments, the second pixel defining layer 31 may be formed by adjusting an etching rate and time of the first spacer 32 of the first pixel defining layer 30. It can be understood that a height of the second pixel defining layer 31 can be controlled by adjusting the etching rate and time of the first spacer 32 of the first pixel defining layer 30.

Figure 3:
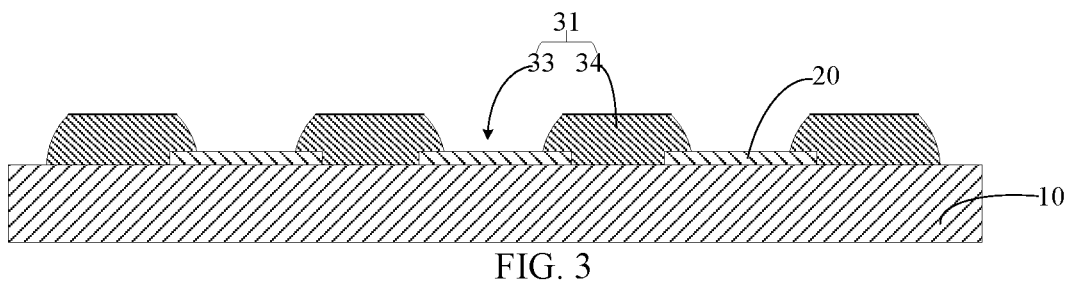
FIG. 3 is a schematic structural diagram of a second intermediate product of the display panel provided by one embodiment of the present disclosure.

It can be understood that, in this embodiment, the first spacer 32 is etched through the mask 70 to form a second spacer 34, and then forming the second pixel defining layer 31. It should be noted that the second pixel defining layer 31 may include the second spacer 34 and the pixel opening 33 exposing the anode layer 20, as shown in FIG. 3.

It can be understood that, since a top of the first spacer 32 is a spherical top, light-emitting layers 40 are easily connected together when subsequently forming the light-emitting layers 40 in area of the pixel openings 33. Therefore, in order to facilitate the separation of the light-emitting layers 40, a dome of the first spacer 32 may be etched to form the second spacer 34 having a planar top.

In order to make the top of the second spacer 34 flatter, in some embodiments, an etching amount at the dome position of the first spacer 32 is greater than an etching amount at other positions of the first spacer 32. It should be noted that other positions of the first spacer 32 may refer to other positions than the dome position of the first spacer 32 exposed by the opening 71.

Figure 5:
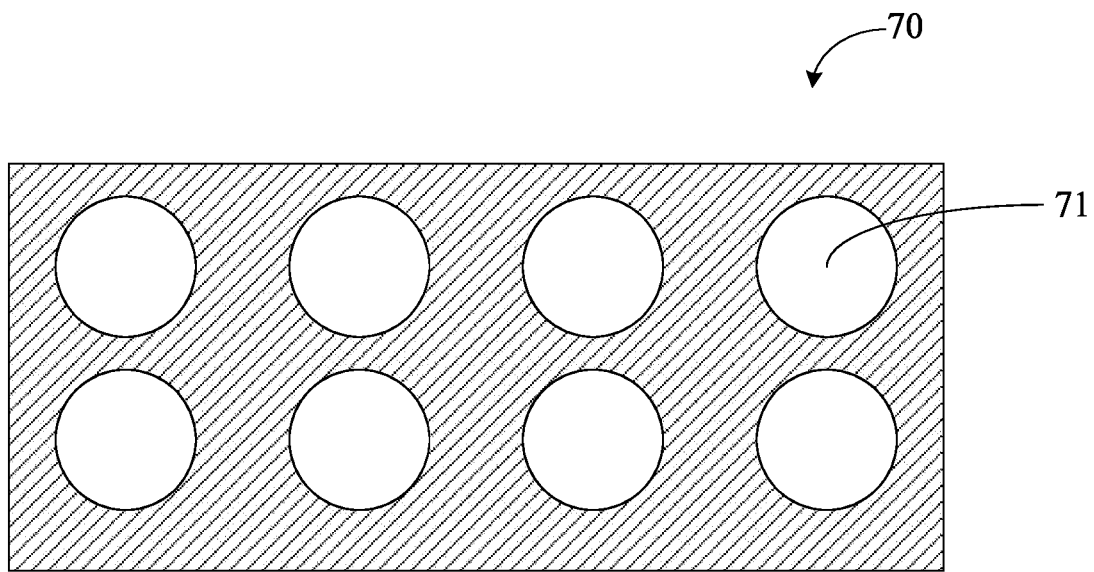
FIG. 5 is a schematic structural diagram of a mask plate provided by one embodiment of the present disclosure.

In some embodiments, as shown in FIG. 5, the mask 70 is provided with a plurality of openings 71. It should be noted that a number of the plurality of openings 71 is the same as a number of the first spacers 32. A shape of the opening 71 is circular. A width of the opening 71 is the same as the width of the side of the first spacer 32 away from the array substrate 10. A pitch between the openings 71 on the mask 70 is the same as a pitch between the first spacers 32.

The openings 71 of the mask 70 may expose the dome of the first spacers 32 of the first pixel defining layer 30 when etching the first pixel defining layer 30 by using the mask 70, that is, exposing a side of the first spacer 32 away from the array substrate 10. Therefore, a part of the mask 70 other than the openings 71 can shield a part of the device other than the top of the first spacers 32.

It can be understood that when using the mask 70 to etch the first pixel defining layer 30, only a first spacer 32 of the first pixel defining layer 30 is etched to form the second spacer 34. Therefore, in the embodiment of the present disclosure, damage to the surface of the anode layer 20 can be prevented by using the mask 70 to etch the first pixel defining layer 30.

105: Forming the light-emitting layer 40 covering the anode layer 20 in the area of the pixel opening 33.

106: Forming a cathode layer 50 on the light-emitting layer 40.

107: Forming an encapsulation layer 60 covering the cathode layer 50, the second pixel defining layer 31, and the array substrate 10.

Figure 4:
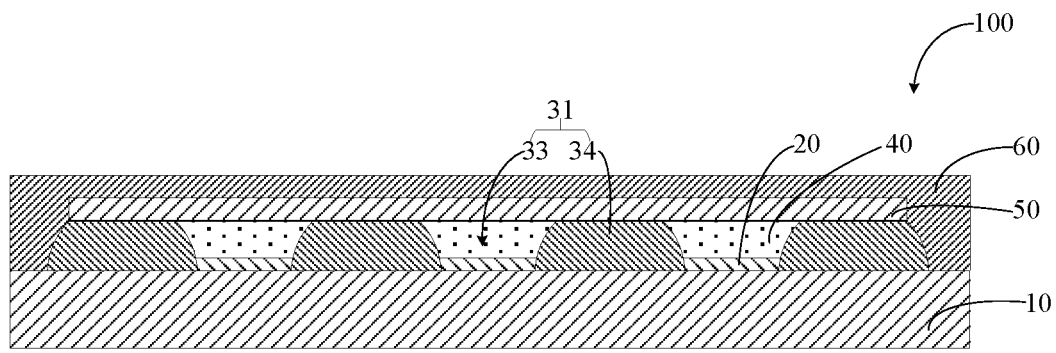
FIG. 4 is a schematic structural diagram of the display panel provided by one embodiment of the present disclosure.

Specifically, a vapor deposition machine may be provided, and forming the light-emitting layer 40 covering the anode layer 20 by vapor deposition in the pixel opening area 33 by the vapor deposition machine, as shown in FIG. 4. It can be understood that a thickness of the light-emitting layer 40 is less than or equal to a thickness of the second pixel defining layer 31.

In the method of manufacturing the display panel provided by the embodiment of the present disclosure, the first pixel defining layer 30 can be manufactured by inkjet printing technology, and the first pixel defining layer 30 is etched by using the mask 70 to form the second pixel defining layer 31. Compared with the exposure and development technology, the embodiments of the present disclosure can simplify the manufacturing process of the pixel defining layer. Moreover, in the embodiments of the present disclosure, an aperture ratio of the pixel opening 33 can be adjusted by adjusting the pitch of nozzles of the inkjet printer, and thus a light-emitting effect of the display panel 100 can be changed, and a height of the second pixel defining layer 31 can be adjusted by adjusting an inkjet amount and an etching time of the inkjet printer. Since a part of the mask 70 other than the opening 71 can shield a part of the device other than a top of the first spacer 32, therefore, it is possible to prevent damage to the surface of the anode layer 20 when etching the first pixel defining layer 30 by the mask 70.

One embodiment of the present disclosure further provides a display panel, and the display panel 100 can be manufactured by the method of manufacturing the display panel provided by the foregoing embodiment. The display panel 100 may be as specifically shown in FIG. 4.

In the above embodiments, the description of each embodiment has its own emphasis. For a part that is not detailed in an embodiment, the related descriptions of other embodiments can be referred.

The method of manufacturing the display panel and the display panel provided by the embodiments of the present disclosure are described in detail above. Specific examples are used in this article to explain the principles and implementation of the present disclosure. The descriptions of the above embodiments are only for help understand the technical solutions and core ideas of the present disclosure; those of ordinary skill in the art should understand that they can still modify the technical solutions described in the foregoing embodiments, or equivalently replace some of the technical features; and these modifications or the replacement does not deviate the essence of the corresponding technical solutions from the scope of the technical solutions of the embodiments of the present disclosure.

What is claimed is:

1. A method of manufacturing a display panel, comprising following steps:

providing an array substrate;
forming an anode layer on the array substrate;
forming a first pixel defining layer on the array substrate and the anode layer, the first pixel defining layer comprising a pixel opening exposing the anode layer;
etching the first pixel defining layer to form a second pixel defining layer;
forming a light-emitting layer covering the anode layer in an area of the pixel opening;
forming a cathode layer on the light-emitting layer; and
forming an encapsulation layer covering the cathode layer, the second pixel defining layer, and the array substrate;
wherein forming the first pixel defining layer on the array substrate and the anode layer comprises:
providing an inkjet printer; and
forming the pixel opening with a certain size on the array substrate and the anode layer by adjusting a pitch of nozzles of the inkjet printer, and forming, on the array substrate and the anode layer, a first spacer that is comprised in the first pixel defining layer and has a certain height by adjusting a jetting volume of ink of the nozzles of the inkjet printer.

2. The method of manufacturing the display panel as claimed in claim 1, wherein the step of etching the first pixel defining layer to form the second pixel defining layer further comprises:
placing a mask on the array substrate on which the first pixel defining layer is formed, wherein the mask is provided with an opening corresponding to the first spacer; and
etching the first spacer of the first pixel defining layer to form the second pixel defining layer, wherein the second pixel defining layer comprises a second spacer and the pixel opening exposing the anode layer.

3. The method of manufacturing the display panel as claimed in claim 2, wherein the step of etching the first spacer of the first pixel defining layer to form the second pixel defining layer comprises:
forming the second pixel defining layer by adjusting an etching rate and etching period for the first spacer of the first pixel defining layer.

4. The method of manufacturing the display panel as claimed in claim 1, wherein the step of forming the light-emitting layer covering the anode layer in the area of the pixel opening further comprises:
providing a vapor deposition machine; and
forming the light-emitting layer covering the anode layer by vapor deposition in the pixel opening area by the vapor deposition machine.

5. The method of manufacturing the display panel as claimed in claim 1, wherein a thickness of the light-emitting layer is less than or equal to a thickness of the second pixel defining layer.

6. The method of manufacturing the display panel as claimed in claim 1, wherein the array substrate comprises a substrate, and a buffer layer, an active layer, a first insulating layer, a gate layer, a second insulating layer, a source-drain layer, and a third insulating layer formed on the substrate in order.

7. A method of manufacturing a display panel, comprising following steps:
providing an array substrate;
forming an anode layer on the array substrate;
forming a first pixel defining layer on the array substrate and the anode layer, the first pixel defining layer comprising a pixel opening exposing the anode layer;
etching the first pixel defining layer to form a second pixel defining layer;
forming a light-emitting layer covering the anode layer in an area of the pixel opening;
forming a cathode layer on the light-emitting layer; and
forming an encapsulation layer covering the cathode layer, the second pixel defining layer, and the array substrate; wherein the first pixel defining layer further comprises a first spacer, and the step of etching the first pixel defining layer to form the second pixel defining layer further comprises:
placing a mask on the array substrate on which the first pixel defining layer is formed, wherein the mask is provided with an opening corresponding to the first spacer; and
etching the first spacer of the first pixel defining layer to form the second pixel defining layer, wherein the second pixel defining layer comprises a second spacer and the pixel opening exposing the anode layer;
wherein the first spacer is a hemisphere, and a width of a side of the first spacer away from the array substrate is less than a width of a side of the first spacer close to the array substrate.

8. The method of manufacturing the display panel as claimed in claim 7, wherein a shape of the opening is circular, and a width of the opening is same as the width of the side of the first spacer away from the array substrate.

9. The method of manufacturing the display panel as claimed in claim 8, wherein an etching amount at a dome position of the first spacer is greater than an etching amount at other positions of the first spacer.

10. A display panel, comprising:
an array substrate;
an anode layer disposed on the array substrate;
a second pixel defining layer disposed on the array substrate and the anode layer, the second pixel defining layer comprising a pixel opening exposing the anode layer;
a light-emitting layer provided in the pixel opening area and covering the anode layer;
a cathode layer disposed on the light-emitting layer; and
an encapsulation layer covering the cathode layer, the second pixel defining layer, and the array substrate;
wherein the second pixel defining layer is formed by etching a first pixel defining layer after forming the first pixel defining layer having a pixel opening exposing the anode layer on the array substrate and the anode layer; the first pixel defining layer further comprises a first spacer, the pixel opening has a certain size and is formed by adjusting a pitch of nozzles of the inkjet printer, and the first spacer has a certain height and is formed by adjusting a jetting volume of ink of nozzles of the inkjet printer;
etching the first pixel defining layer further comprises:
placing a mask on the array substrate on which the first pixel defining layer is formed, wherein the mask is provided with an opening corresponding to the first spacer; and
etching the first spacer of the first pixel defining layer;
wherein the first spacer is a hemisphere, and a width of a side of the first spacer away from the array substrate is less than a width of a side of the first spacer close to the array substrate;
wherein a shape of the opening is circular, and a width of the opening is same as the width of the side of the first spacer away from the array substrate.

11. The display panel as claimed in claim 10, wherein an etching amount at a dome position of the first spacer is greater than an etching amount at other positions of the first spacer.

12. The display panel as claimed in claim 10, wherein the second pixel defining layer further comprises a second spacer, and a width of a side of the second spacer away from the array substrate is less than a width of a side of the second spacer close to the array substrate.

13. The display panel as claimed in claim 10, wherein a thickness of the light-emitting layer is less than or equal to a thickness of the second pixel defining layer.

14. The display panel as claimed in claim 10, wherein the array substrate comprises a substrate, and a buffer layer, an active layer, a first insulating layer, a gate layer, a second insulating layer, a source-drain layer, and a third insulating layer formed on the substrate in order.

\* \* \* \* \*